US007604924B2

(12) United States Patent
Tao et al.

(10) Patent No.: US 7,604,924 B2
(45) Date of Patent: Oct. 20, 2009

(54) NEGATIVE-WORKING IMAGEABLE ELEMENTS AND METHODS OF USE

(75) Inventors: Ting Tao, Fort Collins, CO (US); Eric E. Clark, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 43 days.

(21) Appl. No.: 11/877,841

(22) Filed: Oct. 24, 2007

(65) Prior Publication Data

US 2009/0111051 A1 Apr. 30, 2009

(51) Int. Cl.
*G03F 7/26* (2006.01)
*G03C 1/00* (2006.01)

(52) U.S. Cl. ..................... 430/302; 430/270.1; 101/454

(58) Field of Classification Search ............. 430/270.1, 430/302

See application file for complete search history.

(56) References Cited

U.S. PATENT DOCUMENTS

| | | | | |
|---|---|---|---|---|
| 5,795,698 A | | 8/1998 | Fitzgerald et al. | |
| 6,548,222 B2 | | 4/2003 | Teng | |
| 6,613,494 B2 | | 9/2003 | Savariar-Hauck et al. | |
| 7,172,850 B2 | | 2/2007 | Munnelly et al. | |
| 7,175,969 B1 | * | 2/2007 | Ray et al. | 430/278.1 |
| 2004/0067439 A1 | * | 4/2004 | Zhong et al. | 430/273.1 |
| 2004/0191673 A1 | * | 9/2004 | Sakata | 430/270.1 |
| 2005/0192381 A1 | * | 9/2005 | Bringley et al. | 523/201 |
| 2007/0184380 A1 | | 8/2007 | Tao et al. | |
| 2008/0081542 A1 | * | 4/2008 | Hong et al. | 451/37 |

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

A negative-working imagable composition and element includes an initiator composition, an infrared radiation absorbing compound, a polymeric binder, and a stabilizing composition. The imaged element can be developed on-press and exhibits improved shelf-life under high humidity conditions. The stabilizing composition comprising at least one compound represented by Structure (ST-I) and at least one compound represented by Structure (ST-II):

(ST-I)

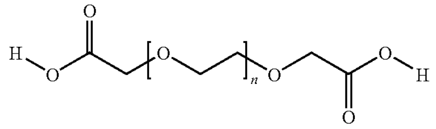

(ST-II)

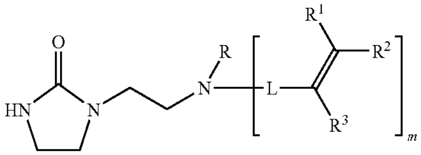

wherein m is 1 or 2, n is 1 to 50, R is hydrogen when m is 1, $R^1$ through $R^3$ are independently hydrogen or methyl, and L is an aliphatic, carbocyclic, heterocyclic, heteroatom divalent linking group, or a combination thereof.

18 Claims, No Drawings

NEGATIVE-WORKING IMAGEABLE ELEMENTS AND METHODS OF USE

FIELD OF THE INVENTION

This invention relates to imagable elements such as negative-working lithographic printing plate precursors that exhibit improved shelf-life stability and can be developed on-press. The invention also relates to methods of using these imagable elements.

BACKGROUND OF THE INVENTION

Radiation-sensitive compositions are routinely used in the preparation of imagable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various negative-working radiation compositions and imagable elements are described in and U.S. Pat. Nos. 6,309,792 (Hauck et al.), 6,569,603 (Furukawa), 6,893,797 (Munnelly et al.), 6,787,281 (Tao et al.), and 6,899,994 (Huang et al.), U.S. Patent Application Publications 2003/0118939 (West et al.), 2005/0008971 (Mitsumoto et al.), 2005/0204943 (Makino et al.), and 2007/0184380 (Tao et al.), and EP 1,079,276A (Lifka et al.), EP 1,182,033A (Fujimaki et al.), and EP 1,449,650A (Goto). Various negative-working imagable elements have been designed for processing or development "on-press" using a fountain solution, lithographic printing ink, or both, as described, for example, in U.S. Patent Application Publication 2005-263021 (Mitsumoto et al.) and in U.S. Pat. Nos. 6,071,675 (Teng), 6,387,595 (Teng), 6,482,571 (Teng), 6,495,310 (Teng), 6,541,183 (Teng), 6,548,222 (Teng), 6,576,401 (Teng), 6,902,866 (Teng), and 7,089,856 (Teng).

Various means for stabilizing imagable elements have been described in the literature and tried in commercial products. For example, U.S. Pat. No. 5,795,698 (Fitzgerald et al.) describes the use of amphoteric hydrogen bond-forming developability stabilizers in lithographic printing plate precursors. U.S. Pat. No. 7,175,969 (Ray et al.) describes an improvement of storage stability by enclosing the imagable elements inside of water-impermeable sheet materials. Specific polymeric binders are used to improve storage stability of on-press developable imagable elements in U.S. Pat. No. 7,172,850 (Munnelly et al.)

PROBLEM TO BE SOLVED

While the on-press developable negative-working imagable elements of the prior art may exhibit considerable advantages and useful properties, there is a continuing need to improve their storage stability or shelf life without any reduction in imaging speed, and run length. It would also be desirable to avoid the use of a post-exposure baking step or an oxygen barrier protective overcoat.

SUMMARY OF THE INVENTION

The present invention provides a negative-working imagable element comprising a substrate having thereon an imagable layer comprising:

a radically polymerizable component, an initiator composition capable of generating free radicals sufficient to initiate polymerization of free radically polymerizable groups upon exposure to infrared imaging radiation, an infrared radiation absorbing compound, a polymeric binder, and a composition comprising at least one compound represented by Structure (ST-I) and at least one compound represented by Structure (ST-II):

(ST-I)

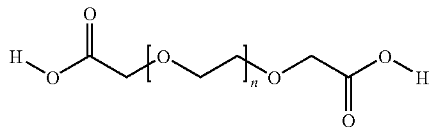

(ST-II)

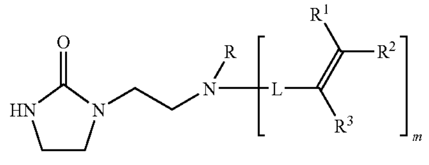

wherein m is 1 or 2, n is 1 to 50, R is hydrogen when m is 1, $R^1$ through $R^3$ are independently hydrogen or methyl, and L is an aliphatic, carbocyclic, heterocyclic, heteroatom divalent linking group, or a combination thereof.

In some embodiments of the imagable element, the imagable layer is the outermost layer, the initiator composition comprises an iodonium borate wherein the iodonium cation includes one or more diaryliodonium cations that are represented by the following Structure (IB):

(IB)

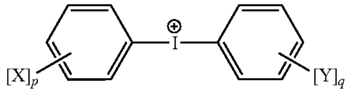

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, the boron-containing anion is represented by the following Structure ($IB_Z$):

($IB_Z$)

wherein $R_1$, $R_2$, $R_3$, and $R_4$ are independently alkyl, aryl, alkenyl, alkynyl, the substrate is a sulfuric acid anodized aluminum-containing substrate having a hydrophilic surface upon which the imagable layer is disposed, the infrared absorbing compound is an infrared absorbing dye, and the imagable layer has one or more compounds of Structure (ST-I) at a molar ratio to one or more compounds of Structure (ST-II) of from about 0.2:1 to about 10:1, and comprises two or more of a poly(ethylene glycol) bis(carboxymethyl)ether, polyethylene glycol diacid,

STAB-1

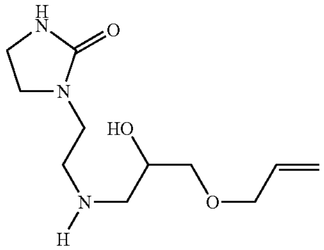

STAB-2

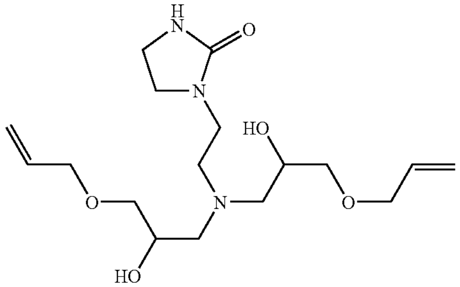

STAB-3

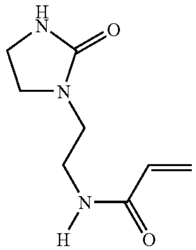

STAB-4

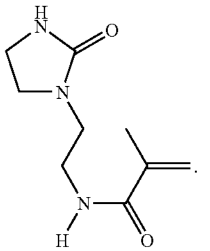

Further, this invention provides a radiation-sensitive composition comprising:

a radically polymerizable component, an initiator composition capable of generating free radicals sufficient to initiate polymerization of free radically polymerizable groups upon exposure to infrared imaging radiation, an infrared radiation absorbing compound, a polymeric binder, and a composition comprising at least one compound from each of Structures (ST-I) and (ST-II):

(ST-I)

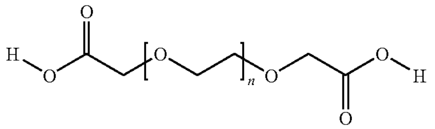

(ST-II)

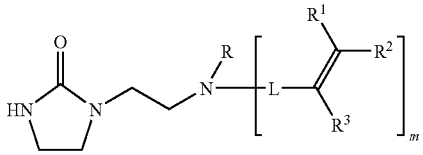

wherein m is 1 or 2, n is 1 to 50, R is hydrogen when m is 1, $R^1$ through $R^3$ are independently hydrogen or methyl, and L is an aliphatic, carbocyclic, heterocyclic, heteroatom divalent linking group, or a combination thereof, and the molar ratio of the compound of Structure (ST-I) to the compound of Structure (ST-II) is from about 0.2:1 to about 10:1.

This invention also includes a method comprising:

A) imagewise exposing an imagable element of this invention using infrared imaging radiation to produce exposed and non-exposed regions, and B) with or without a post-exposure baking step, developing the imagewise exposed element on-press to remove only the non-exposed regions in the presence of a fountain solution, lithographic printing ink, or a combination thereof.

This method can be used, for example, to provide a negative-working lithographic printing plate. For example, the present invention can be used to provide an on-press developed, negative-working lithographic printing plate having a hydrophilic substrate surface, especially a sulfuric acid-anodized aluminum-containing substrate.

The imagable elements of the present invention exhibit a number of improved properties, especially improved shelf life or storage stability before imaging and development. In addition, they exhibit excellent image speed and long run length. These properties can be achieved without the need for a post-imaging baking step in the process of making printing plates, or the use of a protective overcoat in the element. This invention is particularly advantageous for negative-working imagable elements that are designed for on-press development and in which the imagable layer is coated onto a sulfuric acid-anodized aluminum-containing substrate that had also been treated after anodization using a solution of poly(vinyl phosphonic acid) (PVPA) or a phosphate solution that may further contain an inorganic fluoride (PF) to increase hydrophilicity.

DETAILED DESCRIPTION OF THE INVENTION

Definitions

Unless the context indicates otherwise, when used herein, the terms "imagable element", "lithographic printing plate precursor", "printing plate precursor", and "radiation-sensitive composition" are meant to be references to embodiments of the present invention.

In addition, unless the context indicates otherwise, the various components described herein such as "polymeric binder", "free radically polymerizable component", "infrared radiation absorbing compound", "onium salt", "phosphate (meth)acrylate", shelf-life stabilizers of Structure (ST-I) and (ST-II), and similar terms also refer to mixtures of such components. Thus, the use of the articles "a", "an", and "the" is not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imagable Element

The imagable elements include a radiation-sensitive composition disposed on a suitable substrate to form an imagable layer. The imagable elements may have any utility wherever there is a need for an applied coating that is polymerizable using suitable radiation, and particularly where it is desired to remove non-exposed regions of the coating instead of exposed regions. The radiation-sensitive compositions can be used to prepare an imagable layer in imagable elements such as printed circuit boards for integrated circuits, microoptical devices, color filters, photomasks, and printed forms such as lithographic printing plate precursors that are defined in more detail below. The radiation-sensitive composition can also be used in any context or coating (such as painting compositions) where curing can be achieved using suitable radiation, especially infrared or thermal radiation.

The radiation-sensitive composition (and imagable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers or prepolymers, such as urethane acrylates and methacrylates, epoxide acrylates and methacrylates, polyester acrylates and methacrylates, polyether acrylates and methacrylates, and unsaturated polyester resins can also be used.

In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Still other useful free radically polymerizable components include hyperbranched polyester acrylate oligomers such as those commercially available as CN2300, CN2301, CN2302, CN2303, and CN2304 from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (noted above), beginning with paragraph [0170], and in U.S. Pat. Nos. 6,309,792 (Hauck et al.), 6,569,603 (Furukawa), and 6,893,797 (Munnelly et al.).

In some embodiments, the free radically polymerizable component comprises carboxy groups in an amount sufficient to provide an acid number greater than 0 mg KOH per grams of polymerizable component, and generally from 0 and up to and including 200 mg KOH per gram of the polymerizable component. Free radically polymerizable compounds containing carboxy groups can be prepared in a number of ways. For example, oligomers containing carboxy groups can be prepared as described in the teaching of Col. 4 (line 42) to Col. 5 (line 19) and Col. 7 (line 14) to Col. 8 (line 45) of U.S. Pat. No. 4,228,232 (Rousseau). The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)-acrylate can be prepared from the reaction of a diisocyanate with a diol having free carboxy groups similarly to the preparation of allyl functional polyurethanes described in U.S. Pat. No. 5,919,600 (Huang et al.).

In addition to, or in place of the free radically polymerizable components described above, the radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

Useful commercial products that comprise polymers that can be used in this manner include Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer MaterialScience, as well as Laromer™ LR 8949, Laromer™ LR 8983, and Laromer™ LR 9005, that are all available from BASF.

The one or more free radically polymerizable components (monomeric, oligomeric, or polymeric) can be present in the radiation-sensitive composition or imagable layer in an amount of at least 10 weight % and up to 70 weight %, and typically from about 20 to about 50 weight %, based on the total dry weight of the composition or imagable layer. The weight ratio of the free radically polymerizable component to the total polymeric binders (described below) is generally from about 5:95 to about 95:5, and typically from about 10:90 to about 90:10, or even from about 30:70 to about 70:30.

The radiation-sensitive composition also includes an initiator composition that is capable of generating free radicals sufficient to initiate polymerization of the free radically polymerizable component upon exposure of the composition to imaging infrared radiation corresponding to the spectral range of at least 700 nm and up to and including 1400 nm (typically from about 700 to about 1200 nm).

In most embodiments, the free radical generating species is an onium salt. These species are well defined in the literature relating to radiation-sensitive components. The onium salts include but not limited to, sulfonium, oxysulfoxonium, oxysulfonium, sulfoxonium, ammonium, N-alkoxypyridinium, selenonium, arsonium, phosphonium, diazonium, and halonium salts. Further details of useful onium salts, including representative examples, are provided in U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N=N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents such as iodonium salts. The onium salts generally include a suitable number of negatively-charged counterions such as halides, hexafluorophosphate, thiosulfate, hexafluoroantimonate, tetrafluoroborate, sulfonates, hydroxide, perchlorate, n-alkyltriarylborates (such as butyltriphenyl borate), tetraaryl borates (such as tetraphenylborates), and others readily apparent to one skilled in the art.

The iodonium cations are particularly useful. In one embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Useful iodonium salts are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, a useful iodonium salt includes a positively charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

The iodonium cations can be paired with a suitable number of negatively-charged counterions such as halides, hexafluorophosphate, thiosulfate, hexafluoroantimonate, tetrafluoroborate, sulfonates, hydroxide, perchlorate, others readily apparent to one skilled in the art to form suitable iodonium salts.

Thus, the iodonium cations can be supplied as part of one or more iodonium salts, and as described below, the iodonium cations can be supplied as iodonium borates. For example, iodonium cations and boron-containing anions can be supplied as part of salts that are combinations of Structures (IB) and (IBz) described below.

One class of useful iodonium salts include diaryliodoinium cations that are represented by the following Structure (IB):

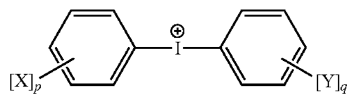

(IB)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, isopropoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, and in many embodiments, either p or q is at least 1. Typically, both p and q are at least 1, or each of p and q is 1. Thus, it is understood that the carbon atoms in the phenyl rings that are not substituted by X or Y groups have a hydrogen atom at those ring positions.

Useful boron-containing anions in the iodonium salts are organic anions having four organic groups attached to the boron atom. Such organic anions can be aliphatic, aromatic, heterocyclic, or a combination of any of these. Generally, the organic groups are substituted or unsubstituted aliphatic or carbocyclic aromatic groups. For example, useful boron-containing anions can be represented by the following Structure ($IB_Z$):

($IB_Z$)

wherein $R_1$, $R_2$, $R_3$, and $R_4$ are independently substituted or unsubstituted alkyl groups having 1 to 12 carbon atoms (such as methyl, ethyl, n-propyl, isopropyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^-$ can be a tetraphenyl borate wherein the phenyl groups are substituted or unsubstituted (for example, all are unsubstituted phenyl groups).

Some representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-4'-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

Such diaryliodonium borates can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry,* 37, 4241-4254 (1999).

The onium salts (such as iodonium salts) are generally present in the radiation-sensitive composition or imagable layer in an amount of at least 1% and up to and including 30%, and typically at least 4 and up to and including about 20%, based on total dry weight. The optimum amount of the onium salts may differ for various compounds and the sensitivity of the radiation-sensitive composition that is desired and would be readily apparent to one skilled in the art.

Other initiator compositions can include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Especially useful azine compounds are triazine compounds that include a 6-membered ring containing 3 carbon atoms and 3 nitrogen atoms such as those described in U.S. Pat. Nos. 6,309,792 (Hauck et al.), 6,010,824 (Komano et al.), 5,885,746 (Iwai et al), 5,496,903 (Watanabe et al.), and 5,219,709 (Nagasaka et al.), all of which are incorporate herein by reference.

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are particularly useful in the initiator composition. Representative compounds of this type include but are not limited to, 1,3,5-triazine derivatives such as those having 1 to 3 —$CX_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis (trichloromethyl)-s-triazine, 2-(p-methoxystyryl)-4,6-bis (trichloromethyl)-s-triazine, 2-(4-methoxy-naphtho-1-yl)-4,6-bis(trichloromethyl)-s-triazine, 2-(4-ethoxynaphtho-1yl)-4,6-bis(trichloromethyl)-s-triazine, and 2-(4-(2-ethoxyethyl)-naphtho-1-yl)-4,6-bis(trichloromethyl)-s-triazine, 2-(4-methylthiophenyl)-4,6-bis(trichloromethyl)-2-triazine, 2-(4-chlorophenyl-4,6-bis(trichloromethyl)-2-triazine, 2,4,6-tri(trichloromethyl)-2-triazine, and 2,4,6-tri (tribromomethyl)-2-triazine.

The azine compounds and particularly the triazine compounds may be used alone or in combination with one or more co-initiators such as titanocenes, mono- and polycarboxylic acids, hexaarylbisimidazoles, as described for example in U.S. Pat. No. 4,997,745 (Kawamura et al.) that is incorporated herein by reference.

Some compositions can include one or more metallocenes that are organometallic compounds having one or more cyclopentadienyl ligands that are optionally substituted at one or all of the ring carbons. Each carbon in the five-member ligand ring is coordinated to the transition metal center. Metallocenes are known for having a wide variety of transition metals including iron, titanium, tungsten, molybdenum, nickel, cobalt, chromium, zirconium, and manganese.

For example, ferrocenes have an iron center coordinated by at least one cyclopentadienyl ligand, but ferrocenes also include bicyclopentadienyl "sandwich" compounds. Suitable ferrocene compounds include those that have a hexhapto benzene ligand coordinated to the iron center. Examples of such compounds are described in Col. 7 of U.S. Pat. No. 6,936,384 (Munnelly et al.) that is incorporated herein by reference. Other suitable ferrocenes include compounds having halogenated, aryl-substituted, or haloaryl-substituted cyclopentadienyl ligands.

Titanocenes are also useful in the practice of this invention. Such compounds have a titanium center coordinated by at least one pentahapto cyclopentadienyl ligand and generally include additional ligands that may be known for organometallic complexes. Some suitable titanocene compounds include in their structures aryl ligands, haloaryl ligands, or pyrrole-substituted aryl ligands. Examples of useful titanocenes include those described in Col. 8 of U.S. Pat. No. 6,936,384 (noted above). One commercially available titanocene is (bis)cyclopentadienyl-(bis)2,6-difluoro-3-(pyrr-1-yl)phen-1-yl titanium sold by Ciba Specialty Chemicals as Irgacure® 784, as noted below with the Examples. Other suitable titanocenes are described in U.S. Pat. Nos. 4,548,891 (Riediker et al.), 4,590,287 (Riediker et al.), 5,008,302 (Husler et al.), 5,106,722 (Husler et al.), 6,010,824 (Komano et al.), and 6,153,660 (Fujimaki et al.).

The radiation-sensitive composition and imagable layer may also include a heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Some useful initiator/co-initiator combinations useful in the practice of this invention include but are not limited to, the following:

a) a triazine as described above in combination with a co-initiator that is an N-aryl, S-aryl, or O-aryl polycarboxylic acid having at least 2 carboxylic acid groups of which at least one is bonded to the nitrogen, sulfur, or oxygen atom of the aryl moiety (such as aniline diacetic acid and derivatives thereof), b) a triazine as described above in combination with a co-initiator that is a mercaptan derivative as described above, c) an iodonium salt (such as an iodonium borate) in combination with a co-initiator that is a metallocene (for example a titanocene or ferrocene) as described above, and d) an iodonium salt (such as a diaryliodonium tetraarylborate) as described above in combination with a co-initiator that is a mercaptotriazole as described above.

The radiation-sensitive composition generally includes one or more radiation absorbing compounds that absorb imaging radiation, or sensitize the composition to imaging radiation of from about 750 nm to about 1500 nm. nm and up to and including 1500 nm (near IR and IR). Thus, the radiation-sensitive composition and imagable layer generally include one or more infrared radiation absorbing compounds (such as pigments or dyes) that absorb imaging infrared radiation, or sensitize the composition to imaging radiation having a $\lambda_{max}$ in the IR region of the electromagnetic spectrum noted above.

Examples of suitable IR dyes include but are not limited to, azo dyes, squarilium dyes, croconate dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,569,603 (noted above), and 6,787,281 (noted above), WO 2004/101280 (Munnelly et al.), and EP Publication 1,182,033 (noted above), that are incorporated herein by reference. Further details of useful IR dyes are described in EP 438,123A (Murofushi et al.), and U.S. Pat. No. 7,135,271 (Kawauchi et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR dyes include but are not limited to, the following compounds, including the IR dye identified as IR Dye A used below in the Examples.

The radiation absorbing compound can be present in the radiation-sensitive composition or imagable element in an amount generally of at least 1% and up to and including 30% and typically at least 2 and up to and including 15%, based on total dry weight. The particular amount needed for this purpose would be readily apparent to one skilled in the art, depending upon the specific compound used.

The radiation-sensitive composition or imagable layer includes one or more polymeric binders, and particularly polymeric binders that facilitate on-press development.

Useful polymeric binders include but are not limited to, (meth)acrylic acid and acid ester resins [such as (meth)acrylates], polyvinyl acetals, phenolic resins, polymers derived from one or more (meth)acrylates, (meth)acrylonitriles, styrene, N-substituted cyclic imides or maleic anhydrides, including those described in EP 1,182,033 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in U.S. Pat. No. 7,175,949 (Tao et al.), and the polymers having pendant vinyl groups as described in U.S. Patent Application Publication 2007/0184380 (Tao et al.). Copolymers of polyethylene glycol methacrylate/acrylonitrile/-styrene in particulate form, dissolved copolymers of carboxyphenyl methacrylamide/acrylonitrile/methacrylamide/N-phenyl maleimide, copolymers of polyethylene glycol methacrylate/acrylonitrile/vinylcarbazole/styrene/-methylacrylic acid, N-phenyl maleimide/-methacrylamide/methacrylic acid, urethane-acrylic intermediate A (the reaction product of p-toluene sulfonyl isocyanate and hydroxylethyl methacrylate)/-acrylonitrile/N-phenyl maleimide, and N-methoxymethyl methacrylamide/methacrylic acid/acrylonitrile/n-phenylmaleimide are also useful.

Some particularly useful polymeric binders include polymeric emulsions or dispersions of polymers having pendant poly(alkyleneoxide) side chains that can render the imagable elements as "on-press" developable. Such primary polymeric binders are described for example in U.S. Pat. Nos. 6,582,882 (noted above), 6,899,994 (noted above), and 7,172,850 (Munnelly et al.), and U.S. Patent Application Publication 2005/0123853 (Munnelly et al.). These primary polymeric binders are generally present in the imagable layer as discrete particles.

Other useful polymeric binders have hydrophobic backbones and comprise both of the following a) and b) recurring units, or the b) recurring units alone:

a) recurring units having pendant cyano groups attached directly to the hydrophobic backbone, and b) recurring units having hydrophilic pendant groups comprising poly(alkylene oxide) segments.

These polymeric binders comprise poly(alkylene oxide) segments such as poly(ethylene oxide) segments. These polymers can be graft copolymers having a main chain polymer and poly(alkylene oxide) pendant side chains or segments or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are useful.

By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

Also by way of example, such polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ether methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in such polymeric binders is from about 0.5 to about 60 weight % and typically from about 2 to about 50 weight %. The amount of (alkylene oxide) segments in the block copolymers is generally from about 5 to about 60 weight % and typically from about 10 to about 50 weight %. It is also likely that the polymeric binders having poly(alkylene oxide) side chains are present in the form of discrete particles.

The polymeric binder is generally present in the radiation-sensitive composition (or imagable layer) in an amount of at least 10% and up to 90%, and typically from about 10 to about 70%, based on the total dry weight. These binders may comprise up to 100% of the dry weight of all polymeric binders (including any secondary polymeric binders described below).

For example, the polymeric binder can be present in the imagable layer in an amount of at least 10% and up to 90% based on the total imagable layer dry weight, and has a hydrophobic backbone to which are attached pendant poly(alkylene oxide) side chains, cyano groups, or both, and the element is on-press developable.

Secondary polymeric binders may also be used in the radiation-sensitive composition or imagable layer designed for on-press development in addition to the polymeric binders described above. Such secondary polymeric binders can be any of those known in the art for use in negative-working radiation-sensitive compositions including those used for off-press developable elements. The secondary polymeric binder(s) may be present in an amount of from about 1.5 to about 70 weight % and typically from about 1.5 to about 40%, based on the dry coated weight of the radiation-sensitive composition of imagable layer, and it may comprise from about 30 to about 60 weight % of the dry weight of all polymeric binders.

The secondary polymeric binders can also be particulate polymers that have a backbone comprising multiple (at least two) urethane moieties. Such polymeric binders generally have a molecular weight ($M_n$) of at least 2,000 and typically at least 100,000 to about 500,000, or from about 100,000 to about 300,000, as determined by dynamic light scattering. These polymeric binders generally are present in the radiation-sensitive composition or imagable layer in particulate form, meaning that they exist at room temperature as discrete particles, for example in an aqueous dispersion. However, the particles can also be partially coalesced or deformed, for example at temperatures used for drying coated imagable layer formulations. Even in this environment, the particulate structure is not destroyed. In most embodiments, the average particle size of these polymeric binders is from about 10 to about 300 nm and typically the average particle size is from about 30 to about 150 nm. The particulate secondary polymeric binder is generally obtained commercially and used as an aqueous dispersion having at least 20% and up to 50% solids. It is possible that these polymeric binders are at least partially crosslinked among urethane moieties in the same or different molecules, which crosslinking could have occurred during polymer manufacture. This still leaves the free radically polymerizable groups available for reaction during imaging.

Additional useful secondary polymeric binders are particulate poly(urethane-acrylic) hybrids that are distributed (usually uniformly) throughout the imagable layer. Each of these hybrids has a molecular weight of from about 50,000 to about 500,000 and the particles have an average particle size of from about 10 to about 10,000 nm (preferably from about 30 to about 500 nm and more preferably from about 30 to about 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents.

Shelf-Life Stabilizers

The radiation-sensitive composition and imagable elements include a composition that has two or more non-polymeric organic compounds having hydrophilic groups or segments such as carboxylic acid, (meth)acrylamide, imidazolidinyl, and poly(alkylene oxide) groups or segments. For example, one class of useful stabilizers includes polyglycol diacids that are available from Aldrich Chemical Company (Milwaukee, Wis.) as poly(ethylene glycol) bis(carboxymethyl)ethers (MW of 250 to 600) or as polyethylene glycol diacid (MW of 600).

More particularly, the present invention utilizes at least one organic compound represented by each of Structures (ST-I) and (ST-II), shown below. In other words, at least one compound of Structure (ST-I) and at least one compound of Structure (ST-II) are present in the radiation-sensitive composition or imagable layer. These compounds could be labeled as "aging stabilizers", "shelf-life stabilizers" or "shelf-life extenders".

Useful compounds can be represented by each of the following Structures (ST-I) and (ST-II):

(ST-I)

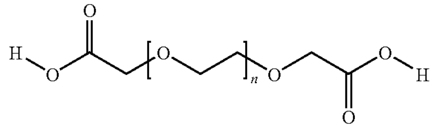

(ST-II)

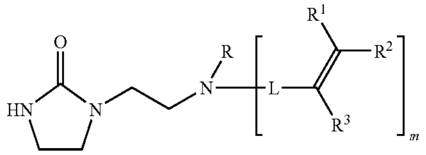

wherein m is 1 or 2, n is 1 to 50, R is hydrogen when m is 1, $R^1$ through $R^3$ are independently hydrogen or methyl, and L is an aliphatic, carbocyclic, heterocyclic, heteroatom divalent linking group, or a combination thereof. Thus, L can include one or more of the noted divalent linking groups in any order as long as the bonding with the connected nitrogen and carbon atoms is chemically possible.

By "aliphatic divalent linking group", we mean a divalent connecting group that can include one or more carbon, nitrogen, oxygen, or sulfur atoms in the connecting chain, as well as one or more of such atoms in side chains connected to the connecting chain. Aliphatic divalent linking groups also include hydrocarbon divalent linking groups such as substituted or unsubstituted alkylene, substituted or unsubstituted alkenylene, substituted or unsubstituted alkynylene, and substituted or unsubstituted cycloalkylene groups. By "carbocyclic divalent linking group", we mean a divalent, aromatic or non-aromatic 5- to 10-membered carbon-containing cyclic connecting group (such as cycloalkylene and arylene) that can have one or more substituted or unsubstituted rings and one or more substituents containing carbon, sulfur, oxygen, or sulfur atoms. By "heterocyclic divalent linking group", we mean a divalent 5- to 10-membered heterocyclic ring having carbon, nitrogen, oxygen, or sulfur atoms in the ring system, and one or more substituents of any chemically possible type. By "heteroatom divalent linking group", we mean non-carbon atoms that can be used to link various atoms in the chain, including sulfur (—S—), selenium (—Se—), and oxygen (—O—) groups.

Examples of useful divalent linking groups include, but are not limited to an —O—, —S—, alkylene, cycloalkylene, alkenylene, arylene, sulfonyl, carbonyl, —CH(OH)—, —C(═O)O—, —O—C(═O)—, or heterocyclene group, or a combination of two or more of such groups. Each of these groups can be substituted with one or more substituents. More specific examples include methylene, ethylene, and $—CH_2CH(OH)CH_2—O—CH_2—$ groups, all of which can be further substituted.

In some embodiments, n is 3 to 20.

Examples of stabilizing compounds comprise poly(ethylene glycol) bis(carboxymethyl)ether, polyethylene glycol diacid,

STAB-1

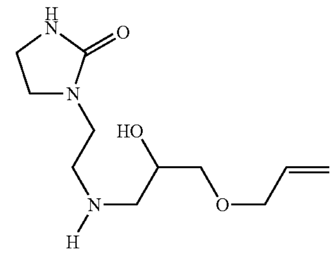

STAB-2

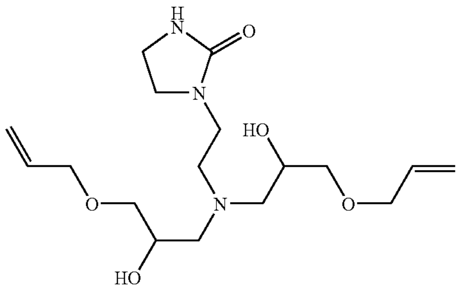

STAB-3

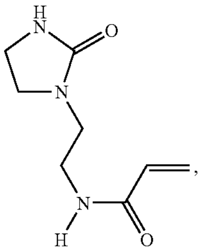

, and

STAB-4

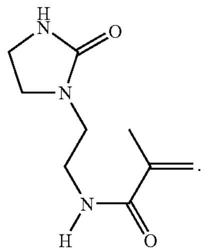

.

Other useful compounds are available as Sipomer WAM and Sipomer WAM II from Rhodia (Cranbury, N.J.) and as 1-[N-[poly(3-alkyloxy-2-hydroxypropyl)]-2-aminoethyl]-2-imidazolidinone from Aldrich Chemical Company.

These compounds can be used in combination, particularly to have one from each of Structures (ST-I) and (ST-II), and thus, two or more of such compounds can be present.

The one or more compounds of Structure (ST-I) are present at a molar ratio to one or more compounds of Structure (ST-II) of from about 0.2:1 to about 10:1, and typically from about 0.5:1 to about 5:1.

Optional Additives

If desired, the radiation-sensitive composition or imagable layer can also include a spirolactone or spirolactam colorant precursor. Such compounds are generally colorless or weakly colored until the presence of an acid causes the ring to open providing a colored species, or more intensely colored species.

For example, useful spirolactone and spirolactam colorant precursors include compounds represented by the following Structure (CF):

(CF)

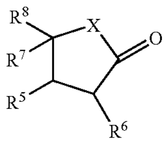

wherein X is —O— or —NH—, $R^5$ and $R^6$ together form a carbocyclic or heterocyclic fused ring. The carbocyclic fused ring can be saturated or unsaturated and is typically 5 to 10 carbon atoms in size. Typically, 6-membered benzene fused rings are present. These rings can be substituted or unsubstituted.

$R^7$ and $R^8$ are independently substituted or unsubstituted carbocyclic groups that are either saturated (aryl groups) or unsaturated (cycloalkyl groups). Typically, they are substituted or unsubstituted aryl groups having 6 or 10 carbon atoms in the ring. $R^7$ and $R^8$ can also be independently 5- to 10-membered, substituted or unsubstituted heterocyclic groups (such as pyrrole and indole rings). Alternatively, $R^7$ and $R^8$ together can form a substituted or unsubstituted carbocyclic or heterocyclic ring as previously defined.

More useful colorant precursors can be represented by the following Structure (CF-1):

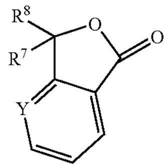

wherein Y is a nitrogen atom or methine group and $R^7$ and $R^8$ are as described above.

Examples of useful colorant precursors include but are not limited to, Crystal Violet Lactone, Malachite Green Lactone, 3-(N,N-diethylamino)-6-chloro-7-(β-ethoxyethylamino) fluoran, 3-(N,N,N-triethylamino)-6-methyl-7-anilinofluoran, 3-(N,N-diethylamino)-7-chloro-7-o-chlorofluoran, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-chlorofluoran, 3-(N,N-diethylamino)-7-(4-chloroanilino)fluoran, 3-(N,N-diethylamio)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis((1-n-butyl-2-methylindol-3-yl)phthalide, 3,3-bis(p-dimethylaminophenyl)-6-dimethylaminophthalide, 3-(4-diethylamino-2-ethoxyphenyl)-3-

(1-ethyl-2-methylindol-3-yl)-4-phthalide, and 3-(4-diethylaminophenyl)-3-(1-ethyl-2-methylindol-3-yl) phthalide.

The colorant precursor described above can be present in an amount of at least 1 and up to 10 weight %, and typically from about 3 to about 6 weight %, based on the total dry imagable layer weight.

The radiation-sensitive composition (or imagable layer) can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety.

Each phosphate moiety is typically connected to an acrylate moiety by an aliphatic chain [that is, an -(aliphatic-O)— chain] such as an alkyleneoxy chain [that is an -(alkylene-O)$_m$— chain] composed of at least one alkyleneoxy unit, in which the alkylene moiety has 2 to 6 carbon atoms and can be either linear or branched and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Useful phosphate (meth)acrylates can be represented by the following Structure (I):

$$P(=O)(OM)_n(OR)_{3-n} \quad (I)$$

wherein n is 1 or 2, M is hydrogen or a monovalent cation (such as an alkali metal ion, ammonium cations including cations that include one to four hydrogen atoms). For example, useful M cations include but are not limited to sodium, potassium, $—NH_4$, $—NH(CH_2CH_2OH)_3$, and $—NH_3(CH_2CH_2OH)$. When n is 2, the M groups are the same or different.

The R groups are independently the same or different groups represented by the following Structure (II):

(II)

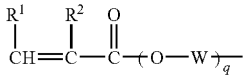

wherein $R^1$ and $R^2$ are independently hydrogen, or a halo (such as chloro or bromo) or substituted or unsubstituted alkyl group having 1 to 6 carbon atoms (such as methyl, chloromethyl, methoxymethyl, ethyl, isopropyl, and t-butyl groups). In many embodiments, one or both of $R^1$ and $R^2$ are hydrogen or methyl, and in some embodiments, $R^1$ is hydrogen and $R^2$ is methyl).

W is an aliphatic group having at least 2 carbon or oxygen atoms, or combination of carbon and oxygen atoms, in the chain, and q is 1 to 10. Thus, W can include one or more alkylene groups having 1 to 8 carbon atoms that are interrupted with one or more oxygen atoms (oxy groups), carbonyl, oxycarbonyl, or carbonyl oxy groups. For example, one such aliphatic group is an alkylenecarbonyloxyalkylene group. Useful alkylene groups included in the aliphatic groups have 2 to 5 carbon atoms and can be branched or linear in form.

The R groups can also independently be the same or different groups represented by the following Structure (IIa):

(IIa)

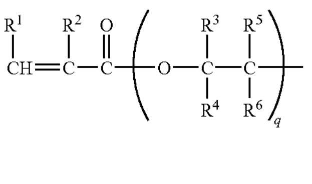

wherein $R^1$, $R^2$, and q are as defined above and $R^3$ through $R^6$ are independently hydrogen or a substituted or unsubstituted alkyl group having 1 to 6 carbon atoms (such as methyl, methoxymethyl), ethyl, chloromethyl, hydroxymethyl, ethyl, isopropyl, n-butyl, t-butyl, and n-pentyl groups). Typically, $R^3$ through $R^6$ are independently hydrogen or methyl, and in most embodiments, all are hydrogen.

In Structures II and IIa, q is 1 to 10, or from 2 to 8, for example from 3 to 6.

Representative phosphate (meth)acrylates include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of a di(caprolactone modified 2-hydroxyethyl methacrylate) that is available as Kayamer PM-21 (Nippon Kayaku, Japan) that is also shown below, and a polyethylene glycol methacrylate phosphate with 4-5 ethoxy groups that is available as Phosmer PE from Uni-Chemical Co., Ltd. (Japan) that is also shown below. Other useful compounds of this type are commercially available from Sartomer Company, Inc. (Exton, Pa.) as Sartomer SR 705, SR 9011, SR 9012, CD 9050, CD 9051, and CD 9053. Still other useful nonionic phosphate acrylates are also shown below.

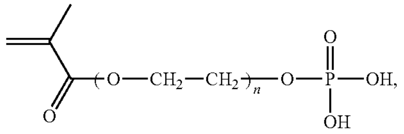

Phosmer PE (n = 4 or 5)

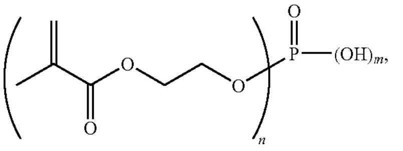

Kayamer PM-2 (m = 1 or 2, n = 3 - m)

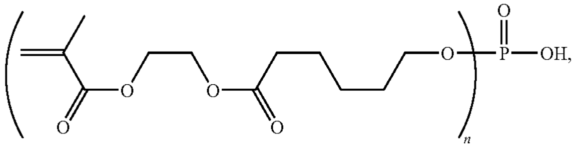

Kayamer PM-21 (n = 2)

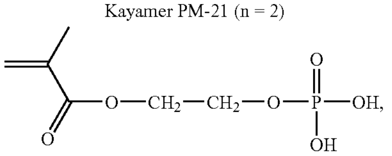

Phosmer M

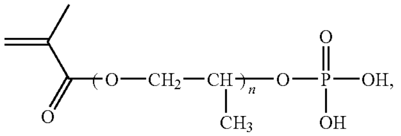

Phosmer PP (n = 5 or 6)

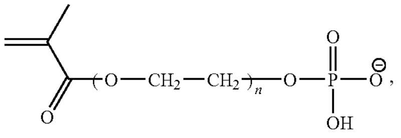

$HOCH_2CH_2NH_3^+$

Phosmer PEH (n is 4 or 5)

-continued

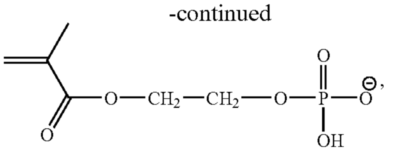

and $HOCH_2CH_2NH_3^+$

Phosmer MH

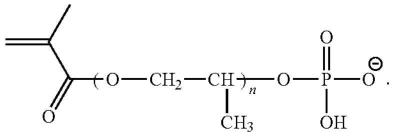

$HOCH_2CH_2NH_3^+$

Phosmer PPH (n is 5 or 6)

The phosphate (meth)acrylate can be present in the radiation-sensitive composition (or imagable layer) in an amount of at least 0.5 and up to and including 20% and typically at least 0.9 and up to and including 10%, based on total dry weight.

The radiation-sensitive composition or imagable layer can also include a "primary additive" that is a poly(alkylene glycol) or an ether or ester thereof that has a molecular weight of at least 200 and up to and including 4000. This primary additive can be present in an amount of at least 2 and up to and including 50 weight %, based on the total dry weight of the imagable layer. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth) acrylate, and polyethylene glycol mono methacrylate. Also useful are Sartomer SR9036 (ethoxylated (30) bisphenol A dimethacrylate), CD9038 (ethoxylated (30) bisphenol A diacrylate), and Sartomer SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The radiation-sensitive composition can also include a "secondary additive" that is a poly(vinyl alcohol), a poly (vinyl pyrrolidone), poly(vinyl imidazole), or polyester in an amount of up to and including 20 weight % based on the total dry weight.

Additional additives to the radiation-sensitive composition or imagable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). Specific examples of phenolic compounds include but are not limited to, 2,4-dihydroxybenzophenone, 4,4'-isopropylidene-diephenol (Bisphenol A), p-t-butylphenol, 2,4,-dinitrophenol, 3,4-dichlorophenol, 4,4'-methylene-bis(2,6'-di-t-butylphenol), p-phenylphenol, 1,1-bis(4-hydroxyphenyl)cyclohexane, 1,1-bis(4-hydroxyphenyl)-2-ethylhexene, 2,2-bis(4-hydroxyphenyl)butane, 2,2'-methylenebis(4-t-butylphenol), 2,2'-methylenebis(α-phenyl-p-cresol)thiodiphenol, 4,4'-thiobis(6-t-butyl-m-cresol)sulfonyldiphenol, p-butylphenol-formalin condensate, and p-phenylphenol-formalin condensate. Examples of useful organic acids or salts thereof include but are not limited to, phthalic acid, phthalic anhydride, maleic acid, benzoic acid, gallic acid, o-toluic acid, p-toluic acid, salicyclic, 3-t-butylsalicyclic, 3,5-di-3-t-butylsalicyclic acid, 5-α-methylbenzylsalicyclic acid, 3,5-bis(α-methylbenzyl)salicyclic acid, 3-t-octylsalicyclic acid, and their zinc, lead, aluminum, magnesium, and nickel salts. Examples of the oxybenzoic acid esters include but are not limited to, ethyl p-oxybenzoate, butyl p-oxybenzoate, heptyl p-oxybenzoate, and benzyl p-oxybenzoate. Such color developers may be present in an amount of from about 0.5 to about 5 weight %, based on total dry weight.

The radiation-sensitive composition and imagable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly (vinyl pyrrolidones).

Imagable Elements

The imagable elements can be formed by suitable application of a radiation-sensitive composition as described above to a suitable substrate to form an imagable layer. This substrate can be treated or coated in various ways as described below prior to application of the radiation-sensitive composition to improve hydrophilicity. Typically, there is only a single imagable layer comprising the radiation-sensitive composition.

The element may include what is conventionally known as an overcoat (such as an oxygen impermeable topcoat) applied to and disposed over the imagable layer for example, as described in WO 99/06890 (Pappas et al.). Such overcoat layers can comprise a water-soluble polymer such as a poly (vinyl alcohol), poly(vinyl pyrrolidone), poly(ethyleneimine), or poly(vinyl imidazole), copolymers of two or more of vinyl pyrrolidone, ethyleneimine, and vinyl imidazole, and mixtures of such polymers. However, in most embodiments, this overcoat is not present, and the imagable layer is the outermost layer of the imagable element.

The substrate generally has a hydrophilic surface, or at least a surface that is more hydrophilic than the applied radiation-sensitive composition on the imaging side. The substrate comprises a support that can be composed of any material that is conventionally used to prepare imagable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuring acid anodized aluminum support that provides a hydrophilic surface for lithographic printing.

Sulfuric acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth) acrylic acid], poly(acrylic acid), or an acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with poly(acrylic acid) using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imagable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imagable layer and an optional overcoat formulation is applied to that layer.

Illustrative of such manufacturing methods is mixing the radically polymerizable component, primary polymeric binder, initiator composition including iodonium cation and borate anion, infrared radiation absorbing compound, acid-initiated colorant precursor, and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imagable layer formulations are described in the Examples below. After proper drying, the coating weight of the imagable layer is generally at least 0.1 and up to and including 5 $g/m^2$ or at least 0.5 and up to and including 3.5 $g/m^2$.

Layers can also be present under the imagable layer to enhance developability or to act as a thermal insulating layer. The underlying layer should be soluble or at least dispersible in the developer and typically have a relatively low thermal conductivity coefficient.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imagable element can be enclosed in water-impermeable material that substantially inhibits the transfer of moisture to and from the imagable element as described for example in U.S. Pat. No. 7,175,969 (Ray et al.).

By "enclosed", we mean that the imagable element is wrapped, encased, enveloped, or contained in a manner such that both upper and lower surfaces and all edges are within the water-impermeable sheet material. Thus, none of the imagable element is exposed to the environment once it is enclosed.

Useful water-impermeable sheet materials include but are not limited to, plastic films, metal foils, and waterproof papers that are usually in sheet-form and sufficiently flexible to conform closely to the shape of the imagable element (or stack thereof as noted below) including an irregularities in the surfaces. Typically, the water-impermeable sheet material is in close contact with the imagable element (or stack thereof). In addition, it is preferred that this material is sufficiently tight or is sealed, or both, so as to provide a sufficient barrier to the movement or transfer of moisture to or from the imagable element. Useful water-impermeable materials include plastic films such as films composed of low density polyethylene, polypropylene, and poly(ethylene terephthalate), metallic foils such as foils of aluminum, and waterproof papers such as papers coated with polymeric resins or laminated with metal foils (such as paper backed aluminum foil). The plastic films and metallic foils are most preferred. In addition, the edges of the water-impermeable sheet materials can be folded over the edges of the imagable elements and sealed with suitable sealing means such as sealing tape and adhesives.

The transfer of moisture from and to the imagable element is "substantially inhibited", meaning that over a 24-hour period, the imagable element neither loses nor gains no more than 0.01 g of water per $m^2$. The imagable element (or stack) can be enclosed or wrapped while under vacuum to remove most of the air and moisture. In addition to or instead of vacuum, the environment (for example, humidity) of the imagable element can be controlled (for example to a relative humidity of less than 20%), and a desiccant can be associated with the imagable element (or stack).

For example, the imagable element can be enclosed with the water-impermeable sheet material as part of a stack of imagable elements, which stack contains at least 5 imagable elements and more generally at least 100 or at least 500 imagable elements that are enclosed together. It may be desir able to use "dummy", "reject", or non-photosensitive elements at the top and bottom of the stack improve the wrapping. Alternatively, the imagable element can be enclosed in the form of a coil that can be cut into individual elements at a later time. Generally, such a coil has at least 1000 $m^2$ of imagable surface, and commonly at least 3000 $m^2$ of imagable surface.

Adjacent imagable elements in the stacks or adjacent spirals of the coil may be separated by interleaving material, for example interleaving paper or tissue ("interleaf paper") that may be sized or coated with waxes or resin (such as polyethylene) or inorganic particles. Many useful interleaving materials are commercially available. They generally have a moisture content of less than 8% or typically less than 6%.

Imaging Conditions

During use, the imagable element is exposed to a suitable source of imaging near-infrared or infrared radiation, depending upon the radiation absorbing compound present in the radiation-sensitive composition.

Imaging radiation is at a wavelength of from about 700 to about 1500 nm. For example, imaging can be carried out using imaging or exposing near-infrared or infrared laser at a wavelength of at least 700 nm and up to and including about 1400 nm and typically at least 750 nm and up to and including 1200 nm. Imaging can be carried out using imaging radiation at multiple wavelengths at the same time if desired.

The laser used to expose the imagable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imagable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/$cm^2$ and up to and including 500 mJ/$cm^2$, and typically at least 50 and up to and including 300 mJ/$cm^2$ depending upon the sensitivity of the imagable layer.

While laser imaging is desired in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

With or without a post-exposure baking step after imaging and before development, the imaged elements prepared according to this invention are developed "on-press" as described in more detail below. In most embodiments, a post-exposure baking step is omitted. On-press development avoids the use of alkaline developing solutions typically used in conventional processing apparatus. The imaged element is mounted on press wherein the unexposed regions in the imagable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

Unless otherwise noted below, the chemical components used in the Examples can be obtained from one or more commercial courses such as Aldrich Chemical Company (Milwaukee, Wis.).

Byk® 336 is available from Byk Chemie (Wallingford, Conn.) in a 25 wt. % xylene/methoxypropyl acetate solution.

Blue 63 is a 3-(4-diethylamino-2-ethoxyphenyl)-3-(1-ethyl-2-methylindol-3-yl)-4-azaphthalide from Yamamoto Chemicals, Inc. (Japan).

Graft polymer A is a polymer dispersion containing 20 wt % styrene, 70 wt % acrylonitrile, and 10 wt % polyethylene glycol methyl ether methacrylate; 24% in propanol/water (80/20) that was prepared using standard reaction conditions and starting materials.

Initiator A represents bis(4-t-butylphenyl) iodonium tetraphenylborate that is available from Hampford Research (Stratford, Conn.).

IR Dye A represents a cyanine dye that has the following structure:

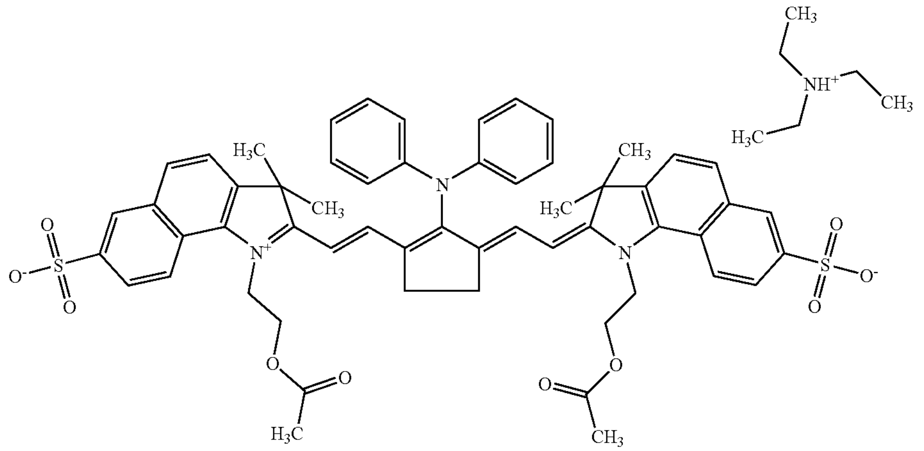

Irgacure® 250 is iodonium, (4-methylphenyl)[4-(2-methylpropyl)phenyl]-, hexafluorophosphate that is available from Ciba Specialty Chemicals (Tarrytown, N.Y.).

Klucel E is hydroxypropyl cellulose available from Hercules Inc. (Wilmington, Del.).

MEK represents methyl ethyl ketone.

Oligomer A is a urethane acrylate prepared by reacting DESMODUR N100 (an aliphatic polyisocyanate resin based on hexamethylene diisocyanate from Bayer Corp., Milford, Conn.) with hydroxyethyl acrylate and pentaerythritol triacrylate (80% wt solution in 2-butanone).

PEGDA is a poly(ethylene glycol) diacrylate with MW=700.

Sartomer SR399 is dipentaerythritol pentaacrylate that was obtained from Sartomer Company, Inc. (Exton, Pa.).

Sipomer PAM-100 is an ethylene glycol methacrylate phosphate with 4-5 ethylene glycol units that was obtained from Rhodia (Cranbury, N.J.).

SLE-A is a poly(ethylene glycol) diacid (MW=600).

SLE-B is an 1-[N-[poly(3-allyloxy-2-hydroxypropyl)]-2-aminoethyl]-2-imidazolidinone.

Invention Example 1

The imagable layer Composition A shown in TABLE I below was prepared to give a 4.5% w/w solution in a solvent mixture of 70% n-propanol, 20% MEK, and 10% water. The resulting formulation was applied to an electrochemically grained, sulfuric acid-anodized, aluminum-containing substrate that had been treated with a poly(vinyl phosphonic acid) (PVPA) using a slot coater at 2.5 $cm^3/ft^2$ (26.9 $cm^3/m^2$) and dried to give a dry imagable layer coverage of 1.0 $g/m^2$. The coating drum temperature was 180° F. (82° C.) and the duration was 80 seconds. After cooling to room temperature, an imagable element (printing plate precursor) was obtained.

Samples of this element were treated under various conditions in order to accelerate the effects of plate ageing. In one test, the elements were wrapped in interleaving and foil and then treated for 5 days at 48° C. (dry aging test). In another case, the elements were hung in a humidity chamber for 5 days at 38° C. and 80% relative humidity (humidity aging test). In still another test, the elements were placed at room temperature in dark (inside a cardboard box) for 5-10 days (natural aging test).

After the various aging conditions (natural, dry and humidity aging), all of the elements were exposed from 50 to 125 $mJ/cm^2$ on a Creo Trendsetter® 3244x (Eastman Kodak Company, Burnaby, Canada). The imaged elements were then directly mounted on an ABDick duplicator press charged with Van Son rubber-based black ink. The fountain solution was Varn 142W etch at 3 oz per gallon (22.5 ml/liter) and PAR alcohol replacement at 3 oz per gallon (22.5 ml/liter). The press was run for 200 impressions, and the development of the imaged elements was assessed at the 200th sheets by visual evaluating as follow: (see TABLE II for development results)

1: Good quality image at 50 $mJ/cm^2$, clean background.

2: Clear differentiation between exposed and non-exposed areas, not completely clean in the background.

3: No differentiation between exposed and non-exposed areas, both having ink heavily.

In a press run length test, the imagable element was subsequently exposed at 120 $mJ/cm^2$ at 15 watts on a Creo Trendsetter® 3244x, and was used to provide 45,000 good impressions on a Komori press using a wear ink containing 1.5% calcium carbonate.

TABLE I

| Components (% solids by weight) | Imageable Layer Composition A | Imageable Layer Composition B | Imageable Layer Composition C | Imageable Layer Composition D | Imageable Layer Composition E |
|---|---|---|---|---|---|
| Oligomer A | 22.5 | 25.5 | 22.5 | 23.0 | 22.5 |
| Graft polymer A | 28.0 | 31 | 28.0 | 28.0 | 28.0 |
| Initiator A | 5.5 | 5.5 | 5.5 | 5.5 | 5.5 |
| Irgacure ® 250 | 3.0 | 3.0 | 3.0 | 3.0 | 3.0 |
| Klucel E | 5.0 | 5.0 | 5.0 | 5.0 | 5.0 |
| IR Dye A | 4.0 | 4.0 | 4.0 | 4.0 | 4.0 |
| Byk ® 336 | 2.3 | 2.3 | 2.3 | 2.3 | 2.3 |

TABLE I-continued

| Components (% solids by weight) | Imageable Layer Composition A | Imageable Layer Composition B | Imageable Layer Composition C | Imageable Layer Composition D | Imageable Layer Composition E |
|---|---|---|---|---|---|
| Sipomer PAM-100 | 1.5 | 1.5 | 1.5 | 1.5 | 1.5 |
| Sartomer SR399 | 15.3 | 18.3 | 18.3 | 15.7 | 15.3 |
| Blue 63 | 4.0 | 4.0 | 4.0 | 4.0 | 4.0 |
| SLE-A | 6.0 | | | 8.0 | |
| SLE-B | 3.0 | | 6.0 | | 3.0 |
| PEGDA | | | | | 6.0 |

TABLE II

| Plate Source | Development rating of Imaged Element | | |
|---|---|---|---|
| | Natural aging | Dry aging | Humidity aging |
| Invention Example 1 | 1 | 1 | 1 |
| Invention Example 2 | 1 | 1 | 1 |
| Comparative Example 1 | 1 | 3 | 3 |
| Comparative Example 2 | 1 | 2 | 2 |
| Comparative Example 3 | 1 | 2 | 2 |
| Comparative Example 4 | 1 | 3 | 3 |

Invention Example 2

The imagable layer Composition A shown in TABLE I above was prepared to give a 4.5% w/w solution in a solvent mixture of 70% n-propanol, 20% MEK, and 10% water. The resulting formulation was applied to an electrochemically grained, sulfuric acid-anodized, aluminum-containing substrate that had been treated with a sodium phosphate fluoride (PF), using a slot coater at 2.5 $cm^3/ft^2$ (26.9 $cm^3/m^2$) and dried to give a dry imagable layer coverage of 1.0 $g/m^2$. The coating drum temperature was 180° F. (82° C.) and the duration was 80 seconds. After cooling to room temperature, an imagable element (printing plate precursor) was obtained.

The same evaluations described in Invention Example 1 were carried out and the development results were shown in TABLE II above.

In a press run length test, the imagable element was subsequently exposed at 120 $mJ/cm^2$ at 15 watts and was used to provide 45,000 good impressions on a Komori press with a wear ink containing 1.5% calcium carbonate.

Comparative Example 1

The imagable layer Composition B shown in TABLE I above was prepared to give a 4.5% w/w solution in a solvent mixture of 70% n-propanol, 20% MEK, and 10% water. The resulting solution was applied to an electrochemically grained, sulfuric acid-anodized, aluminum-containing substrate that had been treated with a solution of poly(vinyl phosphonic acid) (PVPA), using a slot coater at 2.5 $cm^3/ft^2$ (26.9 $cm^3/m^2$) and dried to give a dry imagable layer coverage of 1.0 $g/m^2$. The coating drum temperature was 180° F. (82° C.) and the duration was 80 seconds. After cooling to room temperature, an imagable element (printing plate precursor) was obtained.

The same evaluations described in Invention Example 1 were carried out and the development results were shown in TABLE II above.

Comparative Example 2

The imagable layer Composition C shown in TABLE I above was prepared to give a 4.5% w/w solution in a solvent mixture of 70% n-propanol, 20% MEK, and 10% water. The resulting solution was applied to an electrochemically grained, sulfuric acid-anodized, aluminum-containing substrate that had been treated with a solution of poly(vinyl phosphonic acid) (PVPA), using a slot coater at 2.5 $cm^3/ft^2$ (26.9 $cm^3/m^2$) and dried to give a dry imagable layer coverage of 1.0 $g/m^2$. The coating drum temperature was 180° F. (82° C.) and the duration was 80 seconds. After cooling to room temperature, an imagable element (printing plate precursor) was obtained.

The same evaluations described in Invention Example 1 were carried out and the development results were shown in TABLE II above.

Comparative Example 3

The imagable layer Composition D shown in TABLE I above was prepared to give a 4.5% w/w solution in a solvent mixture of 70% n-propanol, 20% MEK, and 10% water. The resulting solution was applied to an electrochemically grained, sulfuric acid-anodized, aluminum-containing substrate that had been treated with a solution of poly(vinyl phosphonic acid) (PVPA), using a slot coater at 2.5 $cm^3/ft^2$ (26.9 $cm^3/m^2$) and dried to give a dry imagable layer coverage of 1.0 $g/m^2$. The coating drum temperature was 180° F. (82° C.) and the duration was 80 seconds. After cooling to room temperature, an imagable element (printing plate precursor) was obtained.

The same evaluations described in Invention Example 1 were done and the development results were shown in TABLE II.

Comparative Example 4

The imagable layer Composition E shown in TABLE I above was prepared to give a 4.5% w/w solution in a solvent mixture of 70% n-propanol, 20% MEK, and 10% water. The resulting solution was applied to an electrochemically grained, sulfuric acid-anodized, aluminum-containing substrate that had been treated with a solution of poly(vinyl phosphonic acid) (PVPA), using a slot coater at 2.5 $cm^3/ft^2$ (26.9 $cm^3/m^2$) and dried to give a dry imagable layer coverage of 1.0 $g/m^2$. The coating drum temperature was 180° F. (82° C.) and the duration was 80 seconds. After cooling to room temperature, an imagable element (printing plate precursor) was obtained.

The same evaluations described in Invention Example 1 were carried out and the development results were shown in TABLE II above.

The invention has been described in detail with particular reference to certain preferred embodiments thereof, but it will be understood that variations and modifications can be effected within the spirit and scope of the invention.

The invention claimed is:

1. A negative-working imagable element comprising a substrate having thereon an imagable layer comprising:

a radically polymerizable component, an initiator composition capable of generating free radicals sufficient to initiate polymerization of free radically polymerizable groups upon exposure to infrared imaging radiation, an infrared radiation absorbing compound, a polymeric binder, and a composition comprising at least one compound represented by Structure (ST-I) and at least one compound represented by Structure (ST-II):

(ST-I)

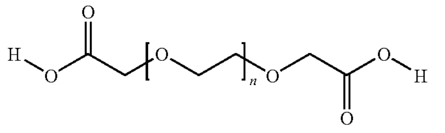

(ST-II)

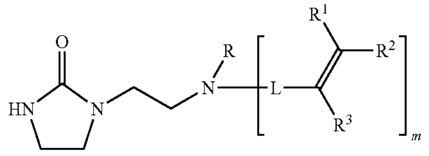

wherein m is 1 or 2, n is 1 to 50, R is hydrogen when m is 1, $R^1$ through $R^3$ are independently hydrogen or methyl, and L is an aliphatic, carbocyclic, heterocyclic, divalent linking group, or a combination thereof.

2. The element of claim 1 wherein said polymeric binder is present in said imagable layer in an amount of at least 10% and up to 90% based on the total imagable layer dry weight, and has a hydrophobic backbone to which are attached pendant poly(allylene oxide) side chains, cyano groups, or both, and the element is on-press developable.

3. The element of claim 1 wherein said initiator composition comprises an onium salt, triazine, metallocene, or a combination thereof.

4. The element of claim 3 wherein said initiator composition comprises an iodonium borate wherein the iodonium cation includes one or more diaryliodonium cations that are represented by the following Structure (IB):

(IB)

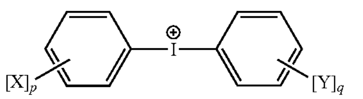

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, and the boron-containing anion is represented by the following Structure ($IB_Z$):

($IB_z$)

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom, such rings having up to 7 carbon, nitrogen, oxygen, or nitrogen atoms.

5. The element of claim 4 wherein at least 3 of $R_1$, $R_2$, $R_3$, and $R_4$ are the same or different substituted or unsubstituted aryl groups, wherein either p or q is at least 1 and the sum of the carbon atoms in the X and Y substituents or fused ring(s) is at least 6.

6. The element of claim 1 wherein said substrate is a sulfuric acid anodized aluminum-containing substrate having a hydrophilic surface upon which said imagable layer is disposed.

7. The element of claim 1 wherein said infrared absorbing compound is an infrared absorbing dye.

8. The element of claim 1 wherein L is a divalent linking group that is an —O—, —S—, alkylene, cycloalkylene, alkenylene, arylene, sulfonyl, carbonyl, —CH(OH)—, —C(=O)O—, —O—C(=O)—, or heterocyclene group, or a combination of two or more of such groups.

9. The element of claim 8 wherein L is methylene, ethylene, or $—CH_2CH(OH)CH_2—O—CH_2—$.

10. The element of claim 1 wherein n is 3 to 20.

11. The element of claim 1 wherein said imagable layer has one or more compounds of Structure (ST-I) at a molar ratio to one or more compounds of Structure (ST-II) of from about 0.2:1 to about 10:1.

12. The element of claim 1 wherein said imagable layer comprises one or more of a poly(ethylene glycol) bis(carboxymethyl)ether, polyethylene glycol diacid,

STAB-1

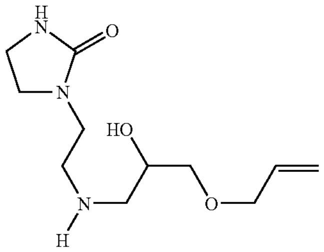

STAB-2

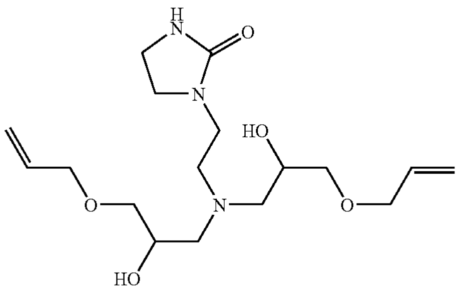

-continued

STAB-3

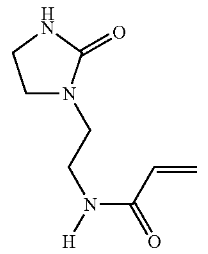

STAB-4

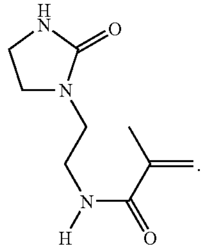

13. The element of claim 1 further comprising one or more phosphate (meth)acrylates.

14. The element of claim 1 wherein said imagable layer is the outermost layer.

15. The element of claim 1 wherein said imagable layer is the outermost layer, said initiator composition comprises an iodonium borate includes one or more diaryliodonium cations that are represented by the following Structure (IB):

(IB)

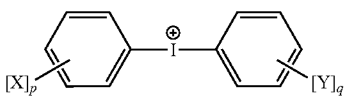

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, and the boron-containing anion is represented by the following Structure ($IB_Z$):

($IB_Z$)

wherein $R_1$, $R_2$, $R_3$, and $R_4$ are independently alkyl, aryl, alkenyl, alkynyl, said substrate is a sulfuric acid anodized aluminum-containing substrate having a hydrophilic surface upon which said imagable layer is disposed, said infrared absorbing compound is an infrared absorbing dye, and said imagable layer has one or more compounds of Structure (ST-I) at a molar ratio to one or more compounds of Structure (ST-II) of from about 0.2:1 to about 10:1, and comprises two or more of a poly(ethylene glycol) bis (carboxymethyl)ether, polyethylene glycol diacid,

STAB-1

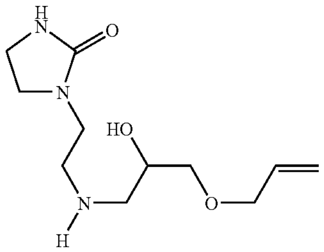

STAB-2

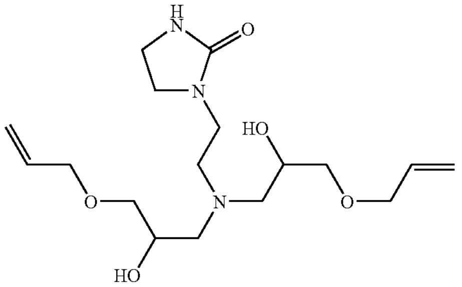

STAB-3

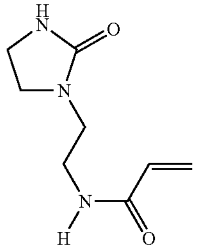

STAB-4

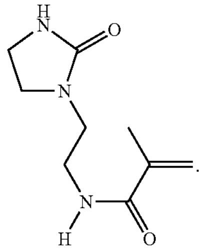

16. A method comprising:

A) imagewise exposing the imagable element of claim 1 using infrared imaging radiation to produce exposed and non-exposed regions, and B) with or without a post-exposure baking step, developing said imagewise exposed element on-press to remove only said non-exposed regions in the presence of a fountain solution, lithographic printing ink, or a combination thereof.

17. The method of claim 16 for preparing a lithographic printing plate having a hydrophilic sulfuric acid anodized aluminum-containing substrate.

18. The method of claim 16 wherein said initiator composition comprises an iodonium borate includes one or more diaryliodonium cations that are represented by the following Structure (IB):

(IB)

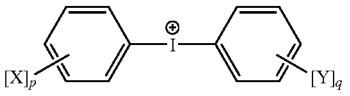

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, provided that either p or q is at least 1, and the boron-containing anion is represented by the following Structure ($IB_Z$):

($IB_Z$)

wherein $R_1$, $R_2$, $R_3$, and $R_4$ are independently alkyl, aryl, alkenyl, alkynyl, said substrate is a sulfuric acid anodized aluminum-containing substrate having a hydrophilic surface upon which said imagable layer is disposed, said substrate having been treated after anodization using a solution of poly(vinyl phosphonic acid) (PVPA) or a phosphate solution that may further contain an inorganic fluoride (PF), said infrared absorbing compound is an infrared absorbing dye, and said imagable layer has one or more compounds of Structure (I) at a molar ratio to one or more compounds of Structure (II) of from about 0.2:1 to about 10:1, and, and comprises one or more of a poly(ethylene glycol) bis (carboxymethyl)ether, polyethylene glycol diacid,

STAB-1

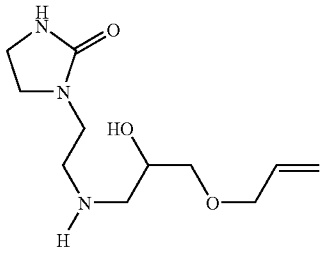

-continued

STAB-2

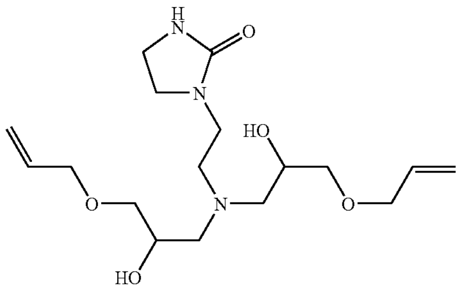

STAB-3

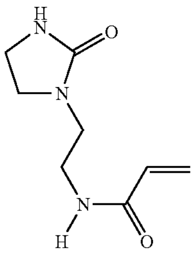

STAB-4

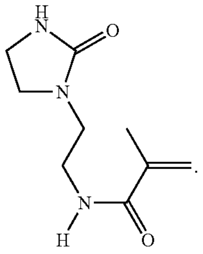

* * * * *